US008798278B2

(12) United States Patent
Isabelle et al.

(10) Patent No.: US 8,798,278 B2
(45) Date of Patent: Aug. 5, 2014

(54) DYNAMIC GAIN ADJUSTMENT BASED ON SIGNAL TO AMBIENT NOISE LEVEL

(75) Inventors: Steven H. Isabelle, Newton, MA (US); Vasu Iyengar, Shrewsbury, MA (US)

(73) Assignee: Bose Corporation, Framingham, MA (US)

(*) Notice: Subject to any disclaimer, the term of this patent is extended or adjusted under 35 U.S.C. 154(b) by 504 days.

(21) Appl. No.: 13/075,536

(22) Filed: Mar. 30, 2011

(65) Prior Publication Data

US 2012/0076311 A1 Mar. 29, 2012

Related U.S. Application Data

(60) Provisional application No. 61/393,526, filed on Oct. 15, 2010, provisional application No. 61/387,281, filed on Sep. 28, 2010.

(51) Int. Cl.
*H03G 3/20* (2006.01)

(52) U.S. Cl.
USPC ............................................. 381/57; 381/58

(58) Field of Classification Search
USPC ................. 381/56, 57, 92, 94.1, 94.7, 95, 96
See application file for complete search history.

(56) References Cited

U.S. PATENT DOCUMENTS 4,811,404 A * 3/1989 Vilmur et al. ................ 381/94.3
4,953,221 A 8/1990 Holly et al.
5,473,684 A * 12/1995 Bartlett et al. ................ 379/395
5,615,256 A 3/1997 Yamashita
5,907,823 A 5/1999 Sjöberg et al.
7,333,618 B2 2/2008 Shuttleworth et al.
8,229,125 B2 * 7/2012 Short ............................. 381/56
8,280,092 B2 * 10/2012 Inoda et al. .................. 381/357
8,340,309 B2 * 12/2012 Burnett et al. ............... 381/71.6
8,385,558 B2 * 2/2013 Prakash et al. ............... 381/71.1
2004/0052384 A1 * 3/2004 Ashley et al. ................ 381/94.1
2004/0057586 A1 3/2004 Licht
2004/0138769 A1 * 7/2004 Akiho ............................ 700/94
2007/0127737 A1 6/2007 Lee
2009/0022329 A1 1/2009 Mahowald
2009/0225980 A1 * 9/2009 Schmidt et al. .......... 379/406.02
2009/0248409 A1 10/2009 Endo et al.
2009/0257613 A1 * 10/2009 Khamashta et al. .......... 381/355
2009/0281800 A1 11/2009 LeBlanc et al.

FOREIGN PATENT DOCUMENTS

WO 2009/042651 4/2009

* cited by examiner

*Primary Examiner* — Duc Nguyen
*Assistant Examiner* — Phan Le

(57) ABSTRACT

Methods and apparatuses for deriving a signal-to-noise ratio based at least in part on a measured level of a signal carrying far-end speech, and a measured level of a signal carrying ambient acoustic noise; determining a target gain adjustment based at least in part on the derived signal-to-noise ratio; applying the target gain adjustment to the signal carrying far-end speech to produce a gain-adjusted signal; and providing the gain-adjusted signal for audio output from a communications device.

11 Claims, 7 Drawing Sheets

DYNAMIC GAIN ADJUSTMENT BASED ON SIGNAL TO AMBIENT NOISE LEVEL

CROSS-REFERENCE TO RELATED APPLICATIONS

This application claims the benefit of U.S. Provisional Application No. 61/387,281 filed Sep. 28, 2010 and U.S. Provisional Application No. 61/393,526 filed Oct. 15, 2010, the content of which are incorporated herein by reference in their entirety.

This application is related to U.S. patent application Ser. No. 13/075,583, entitled "Fine/Coarse Gain Adjustment," U.S. patent application Ser. No. 13/075,635, entitled "Noise Level Estimator," and U.S. patent application Ser. No. 13/075,732, entitled "Single Microphone for Noise Rejection and Noise Measurement," filed concurrently with the present application. The contents of these applications are incorporated herein by reference in their entirety.

BACKGROUND

Bluetooth™-enabled electronic devices connect and communicate wirelessly through short-range, ad hoc networks known as Personal Area Networks (PAN).

SUMMARY

In general, in one aspect, the invention features a method that includes deriving a signal-to-noise ratio based at least in part on a measured level of a signal carrying far-end speech, and a measured level of a signal carrying ambient acoustic noise; determining a target gain adjustment based at least in part on the derived signal-to-noise ratio; applying the target gain adjustment to the signal carrying far-end speech to produce a gain-adjusted signal; and providing the gain-adjusted signal for audio output from a communications device.

Implementation of the invention may include one or more of the following features.

The communications device may include a wireless in-ear headset. The signal-to-noise ratio may be further derived based in part on a user-selected gain adjustment. The user-selected gain adjustment may be provided via a user-operable gain controller component of the communications device. The target gain adjustment may be further determined based in part on a mapping of signal-to-noise ratio to gain in which the mapping approaches a unity gain (0 dB) at high signal-to-noise ratios and has a negative slope of increasing magnitude as the signal-to-noise ratios increase from low to high. The mapping may be expressed as a gain curve.

In general, in another aspect, the invention features a communications device that includes first circuitry operable to derive a signal-to-noise ratio based at least in part on a measured signal level carrying far-end speech, and a measured signal level carrying ambient acoustic noise; second circuitry operable to determine a target gain adjustment based at least in part on the derived signal-to-noise ratio; and third circuitry operable to apply the target gain adjustment to a signal carrying far-end speech to produce a gain-adjusted signal and provide the gain-adjusted signal for output from the device.

Implementation of the invention may include one or more of the following features.

The device may further include an electronics module to wirelessly receive audio signals carrying far-end speech and wirelessly transmit audio signals carrying near-end speech. The device may further include an audio module including an acoustic driver to transduce audio signals to acoustic energy.

The device may include an in-ear component that has an outlet section dimensioned and arranged to fit inside an ear canal of a user; and a passageway to conduct acoustic energy from an audio module to an opening in the outlet section. The device may further include an electronics module that has a microphone with multiple acoustic ports. The microphone may have two acoustic ports with a center-to-center spacing of approximately 6.5 mm. The device may further include a porous member arranged over the microphone to reduce wind noise.

Other features and advantages of the invention are apparent from the following description, and from the claims.

DESCRIPTION

This document describes implementations of a Bluetooth-enabled headset having a single microphone encapsulated in a two-port physical structure. The headset offers superior near-end voice communications quality (i.e., the ability to hear what a far-end communication partner is saying) and far-end voice communications quality (i.e., the ability to be heard by the far-end communication partner).

Figure 1:
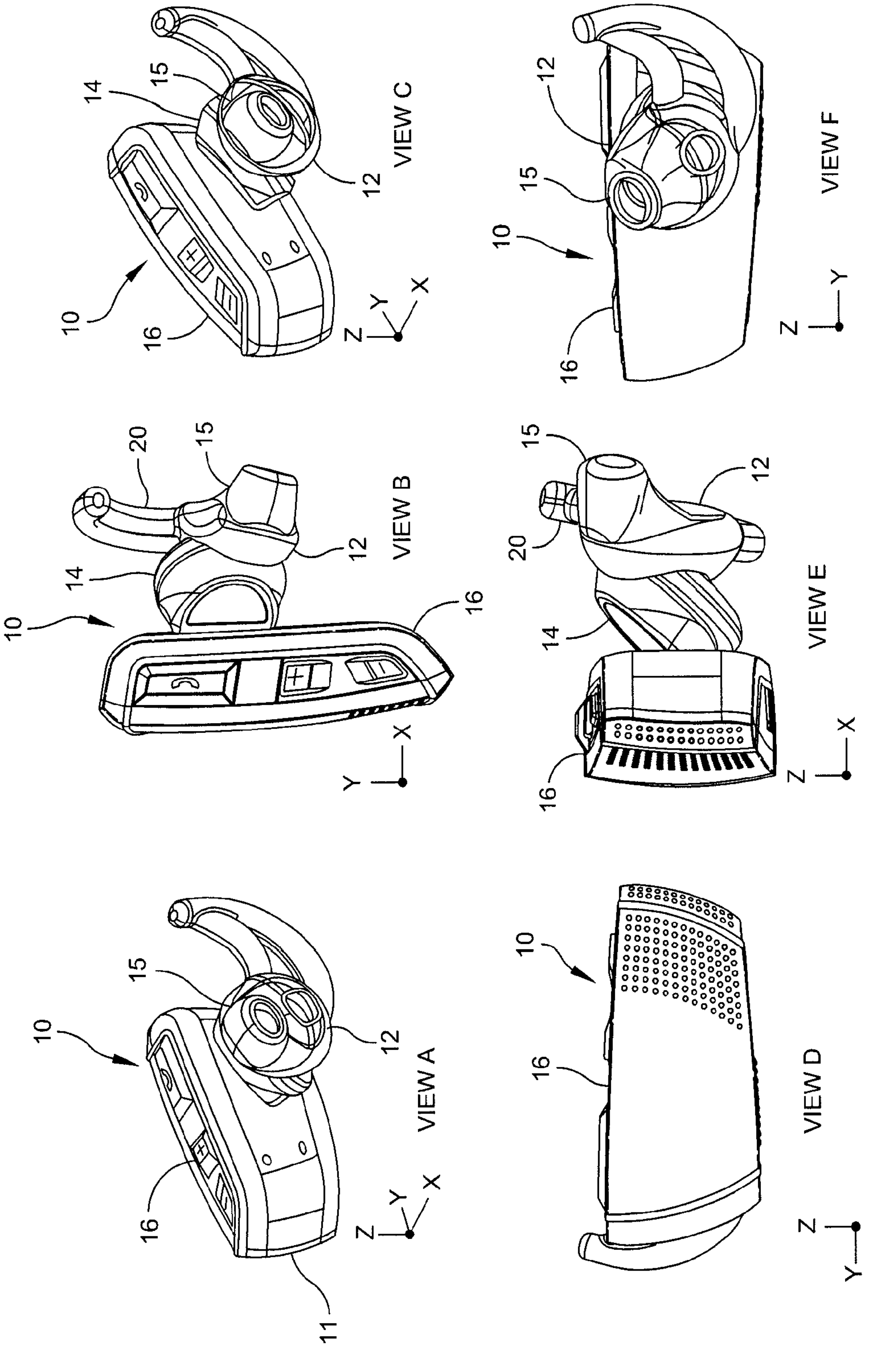
FIGS. 1 and 2 show several views of an in-ear headset.

FIG. 1 shows several views of an in-ear headset 10. The headset 10 includes a body 12 (see View F), an acoustic driver module 14, which may be mechanically coupled to an electronics module 16. The body 12 may have an outlet section 15 that fits into the ear canal. Other reference numbers will be identified below. The headset may be wireless, that is, there may be no wire or cable that mechanically or electronically couples the earpiece to any other device. Some elements of headset 10 may not be visible in some views.

Figure 2:
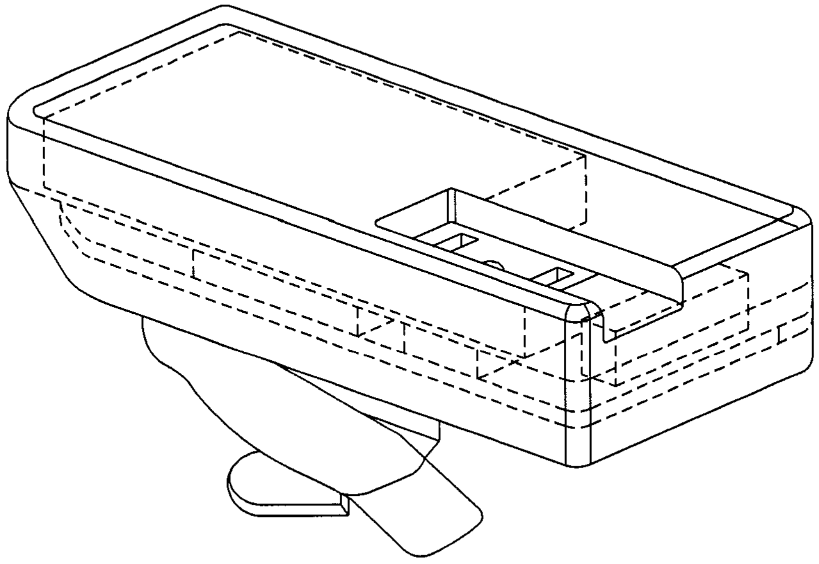

In one implementation, the electronics module 16 is enclosed in a substantially box-shaped housing with planar walls as shown in FIG. 2. The electronics module 16 includes a single microphone with two acoustic ports at one end 18 of the electronics module 16. The electronics module 16 also includes electronic circuitry (not visible in FIG. 2) to wirelessly receive and transmit signals (e.g., using the Bluetooth™ protocol); electronic circuitry (not visible in FIG. 2) to transmit audio signals to, and to control the operation of, the acoustic driver module 14; and other circuitry.

Figure 3A:
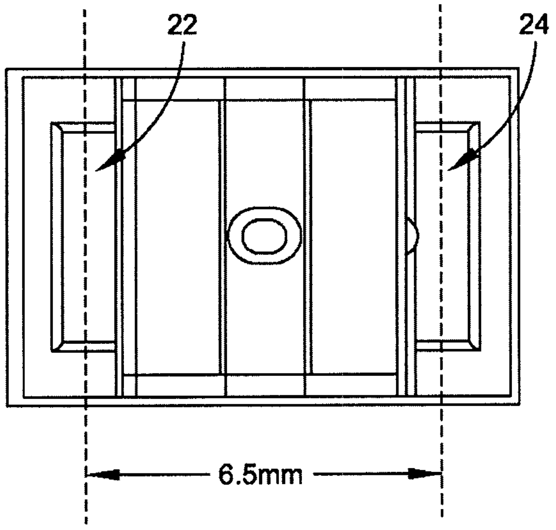
FIGS. 3A, 3B, and 3C show several views of a microphone with multiple acoustic ports.
Figure 3B:
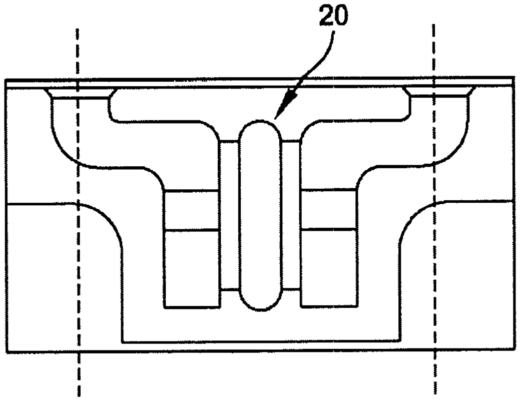
Figure 3C:
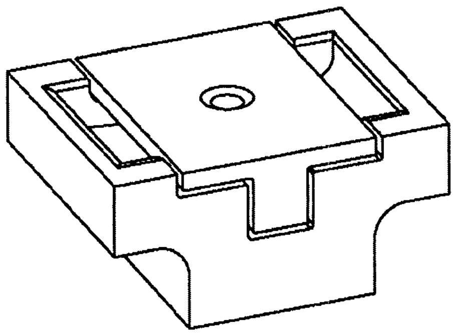

Referring also to FIGS. 3*a*, 3*b*, and 3*c*, the microphone 20 has two acoustic ports 22, 24 (i.e., each port coupled to a corresponding different side of a membrane or other form of sensing element of the microphone) thereby making it generally responsive to acoustic pressure differences between its ports to function in what is generally referred to as a "pressure gradient" or "velocity" mode. The microphone 20 has a physical structure that provides directionality as well as rejection of ambient acoustic noise signals so as to be preferentially sensitive to a user's voice while rejecting ambient environmental noise.

In one implementation, the center-to-center spacing between the two acoustic ports 22, 24 is approximately 6.5 mm, with the ports being formed in a recess in the body of the microphone. The microphone spacing affects the relative gain of the microphone to signals near acoustic sources, in particular the user voice, as compared to the gain to ambient noise, which can be considered as radiating from all directions far from the microphone. Under certain assumptions (e.g., modeling the near source as radiating spherical waves), in order to provide the greatest relative gain to the near signal compared to the ambient signal, the spacing of the ports of the microphone should be as small as possible. However, the absolute gain for both the near signal and the ambient signal falls with decreasing spacing. The 6.5 mm spacing in this embodiment is selected to be as close as possible while maintaining adequate response (e.g., response above the noise floor) to ambient noise to control noise compensation features of the microphone.

The microphone has a central bidirectional (i.e., with one port providing an acoustic path to each side) element with a diameter in the range of 3 mm to 10 mm. In some embodiments the dimension of the microphone element limits the minimum thickness or other dimensions of the microphone, and therefore a smaller diameter element may be preferable. Note that in general, a microphone with a smaller diameter element may have noise characteristics (e.g., signal-to-noise ratios in the range of 57 db to 62 db) which result in substantial noise at low acoustic levels. Therefore, in general, as the diameter decreases, the sensitivity decreases, and an ability of the microphone to sense or discriminate changes at low levels of ambient noise is reduced. One alternative to use of a small diameter element is to use a larger diameter or an amplified microphone, however, such alternatives may require an unacceptable increase in the overall microphone dimensions.

The single microphone 20 provides signal input both to the inbound audio signal path, which includes noise compensation circuitry that uses the signal to estimate a noise level, and to the outbound audio signal path for the transmitted speech signal. Generally, the noise compensation circuitry controls a gain in the inbound audio signal path for providing a received speech signal to an ear of the headset user, with the gain being responsive at least in part to the estimated noise level.

The structure of the microphone 20 provides a balance between ambient noise rejection and ambient noise sensitivity, thereby making the single microphone 20 suited to both providing the audio signal for the outbound audio path as well as to estimating the ambient noise level. In some implementations, the dynamic noise compensation circuit is preferably responsive to ambient acoustic noise levels as low as 50 dB(A) SPL. The microphone 20 generates a level of electrical noise the level of which exceeds the electrical signal generated by low-level acoustic input. Therefore, in order to provide a suitable input to the dynamic noise compensation circuit, the structure of the microphone 20 is preferably selected such that the electrical signal level from an ambient acoustic 50 dB(A) noise (e.g., a one octave noise band centered at 125 Hz) exceeds the electrical noise level of the microphone 20.

Figure 4:
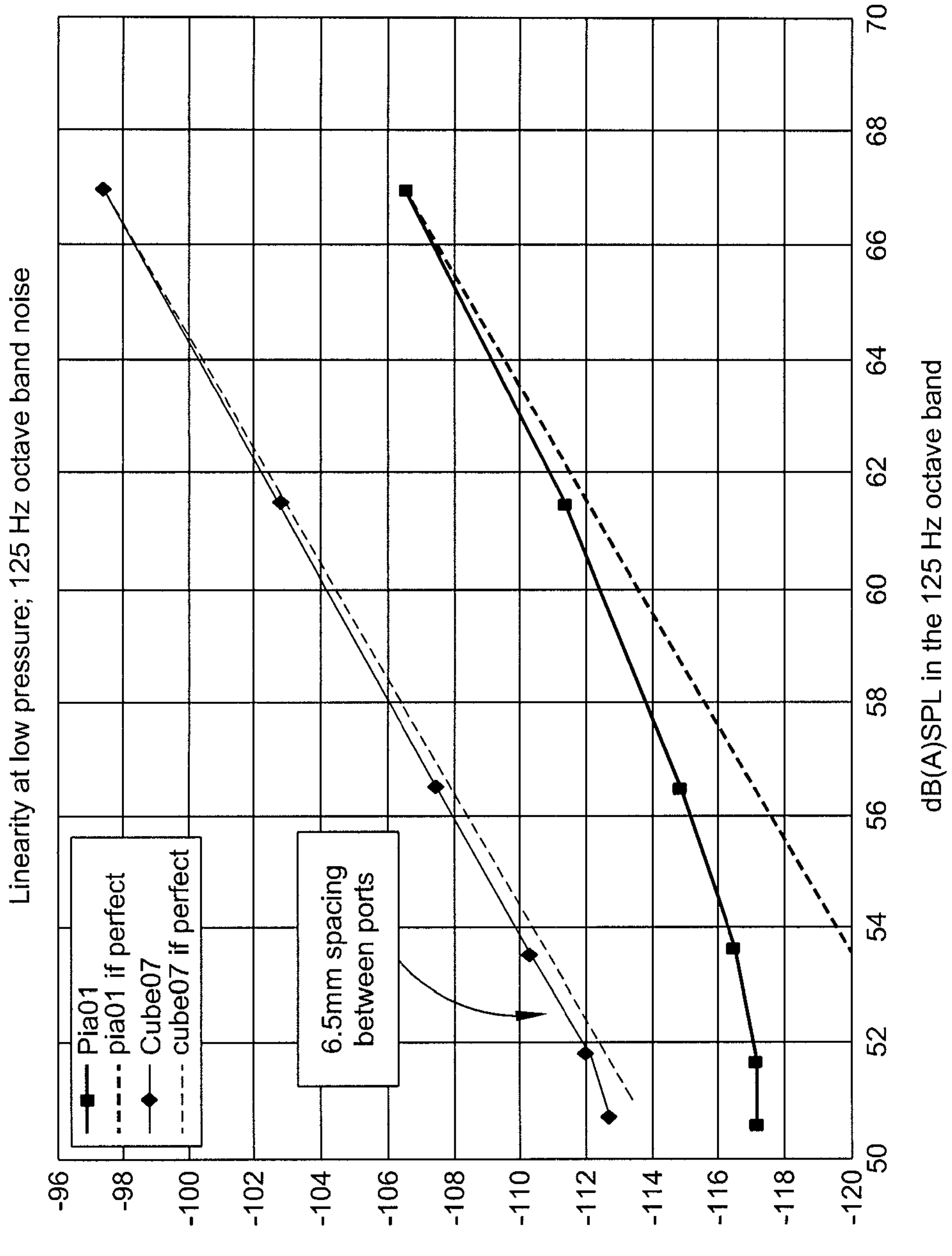
FIG. 4 shows a graph of a microphone-generated electrical signal level as a function of ambient acoustic noise level for a range of noise level from 50 dB (A) to 70 dB(A).

Referring to FIG. 4, electrical signal level generated by the microphone as a function of ambient acoustic noise level is shown for a range of noise level from 50 dB (A) to 70 dB(A). The upper curve represents a 6.5 mm port spacing and shows a relatively linear relationship with a deviation of less than 1 dB as the noise level goes down to 50 dB(A). The lower curve represents a less favorable port spacing of approximately 2.5 mm, which provides directionality and rejection of ambient acoustic noise, but deviates significantly from a linear relationship between input noise level and output signal level for the microphone deviating by over 1 db at 60 dB(A) noise and being relatively insensitive to differences in noise level (e.g., 0.5 dB/1 dB output level/input level) below 54 dB(A) noise level. Therefore, the microphone is structured to provide the upper curve, and thereby provide a suitable input to the noise compensation circuitry. Note that the technical problem of providing the highest relative sensitivity to a voice signal, whose source is relatively close and directional to the microphone, relative to sensitivity to spatially diffuse noise, may be better achieved by the 2.5 mm spacing than the 6.5 mm spacing. However, the technical problem of providing both near-optimal relative sensitivity to voice relative to ambient acoustic noise while providing near-linear response to ambient acoustic noise is best matched by the selection of the 6.5 mm spacing. The use of the single two-port microphone also provides technical advantages over use of two separate pressure-sensitive microphones, whose signals may be combined electrically to provide the outbound signal, including being smaller, and furthermore may be less costly than use of two separate microphones.

A porous membrane (not shown), such as a resistive screen or cloth, may be mounted over the ports 22, 24 to aid in the reduction of wind noise by dissipating the energy from wind turbulences before such wind turbulences strike the microphone 20. In some implementations, the porous membrane is mounted at a distance of least 1 mm from the ports 22, 24. Because the particle velocity of a speech signal is typically smaller than the particle velocity of a wind breeze, the porous membrane does not negatively impact the voice-field sensitivity of the microphone 20.

In general, a user of the microphone may be in an environment with a high and/or changing level of ambient noise, and the inbound speech may vary in level. Therefore, there may be times at which the ambient noise, as heard though the ear in which the microphone is placed as well as in the opposite ear, interferes with the intelligibility (or other desirable qualities) of the inbound speech. Without use of automated noise compensation techniques, a user may be able to adjust (i.e., increase) the volume as the inbound speech becomes weaker or as the ambient noise increase, but the user would have to readjust the volume when the levels change again or else be able to tolerate the volume increase in the ear, which may be unpleasant and/or uncomfortable.

As introduced above, the microphone provides the audio signal for the outbound audio path as well as to estimating the ambient noise level. Generally, the headset implements a dynamic noise compensation (DNC) approach in which a gain on the inbound signal path is controlled in a way that is responsive to an estimated ambient noise level as sensed by the microphone. In some implementations as described below, this gain is responsive to a relative level of an estimated speech signal level in the inbound signal path relative to the estimated noise level, for instance, with the relative level accounting for the sound pressure level presented to the user according to the sensitivity of the microphone and acoustic driver and/or accounting for any attenuation of the ambient noise in the ear due to the ear piece of the microphone. In some implementations, a user-selectable gain is also provided, at least logically, on the inbound signal path, with the DNC controlled gain being responsive to a relative speech signal level after application of the user-selected gain to the ambient noise level.

Figure 5:
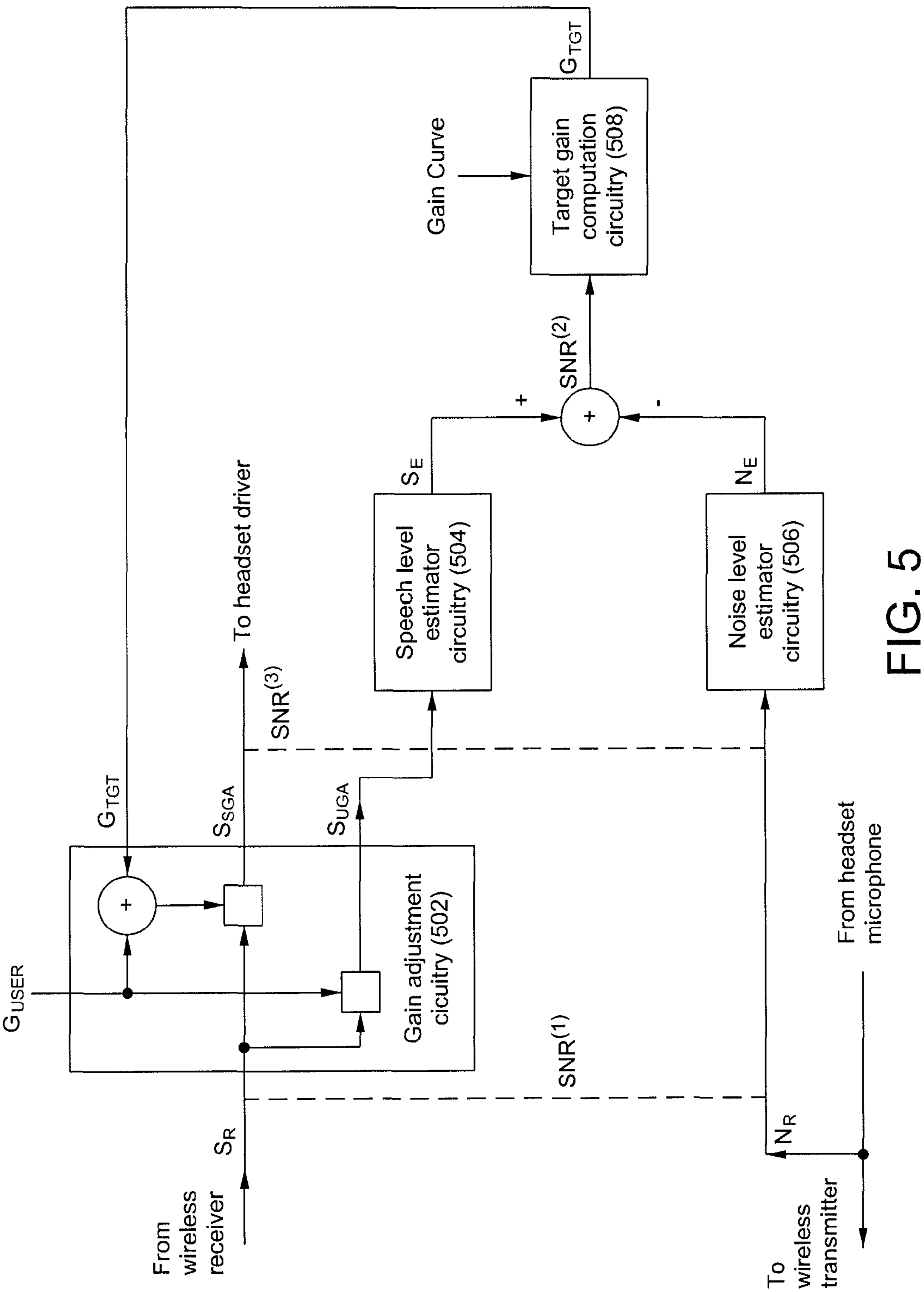
FIG. 5 shows a logical block diagram of one implementation of an in-ear headset.

FIG. 5 shows a logical block diagram of one implementation of the headset 10. The inbound audio signal, $S_R$, carrying the far-end talker's speech (as well as periods of non-speech and/or far-end noise, or speech that is relatively weak relative to such noise) are received over a wireless communication link (e.g., a Bluetooth™ link to a paired mobile telephone). The headset 10 includes a gain-adjustment control, which allows the user to select a gain setting. In some implementations, the gain-adjustment control enables an up/down control of the gain, for instance, permitting changes in increments of plus or minus 3 dB. The user-selected gain, $G_{USER}$, is applied to the inbound audio signals, $S_R$, by gain adjustment circuitry 502 of the headset 10 to produce user-gain-adjusted inbound audio signals, $S_{UGA}$. The user-gain-adjusted inbound audio signal, $S_{UGA}$, is further processed by speech level estimator circuitry 504 to produce a speech level estimate, $S_E$ (in dB).

The microphone provides a signal that is used both for the outbound signal path, as well as input audio signals, $N_R$, carrying local noise received via the microphone 20. For example, this audio signal may include periods that do not include the user's speech and that do include noise received from a distance. Furthermore, the audio signal may include periods in which the user's speech is relatively weak relative to a noise, for example, when a wind gust causes high-level noise burst. As described further below, this input signal is processed by noise level estimator circuitry 506 to compute an A-weighted noise level estimate, $N_E$ (in dB). In the discussion below, the ratio of the speech level estimate to the noise level estimate (i.e., the inbound speech level to ambient noise ratio) is considered to be a signal-to-noise ratio $SNR=S_E-N_E$ (in dB), representing a relative level of the speech signal presented to the user's ear via the acoustic driver to one ear, relative to the ambient noise level arriving at the user's ears via the environment (i.e., directly to the ear that does not have the acoustic driver, and via the acoustic path limited by the physical structure of the acoustic driver in the user's other ear). In some examples, the signal levels are matched such that an SNR=0 corresponds to the ambient noise reaching a user's ear having the same level as the speech signal presented to the user's ear. In some examples, the SNR does not account for the attenuation of the ambient noise by the physical structure in the user's ear, and therefore equal sound level in the ear corresponds to SNR<0.

Application of user-selected gain and DNC controlled gain can be understood with reference to the logical signal flow diagram shown in FIG. 5. Prior to applying the user-selected gain, $G_{USER}$, the signal-to-noise ratio is $SNR^{(1)}$. After the user-selected gain, $G_{USER}$, is applied to the inbound audio signals, $S_R$, the signal-to-noise ratio is $SNR^{(2)}=SNR^{(1)}+G_{USER}$. Generally, the user is expected to set the user-selected gain to make the acoustic signal presented to their ear "comfortable." However, if the inbound speech level or the ambient noise level varies, even with the user-selected gain, the resulting SNR may at times result in difficulty in hearing or understanding the inbound speech or the inbound speech being too loud. Increasing the user-selected gain may result in the signal presented to the user's ear being uncomfortable at times. A technical problem addressed by the DNC approach is to adapt the overall gain of the inbound signal to achieve a comfortable level to the user while maintaining intelligibility during periods of high ambient noise and/or low inbound speech level. Generally, as described below, an approach is to apply a further gain, in addition to the user-selected gain, that varies according to the estimated SNR, for example, providing little or no gain during periods of high SNR, while providing an increasing gain to maintain at least a minimal SNR as the ambient noise level rises and/or the inbound speech level decreases.

The signal-to-noise ratio estimate, $SNR^{(2)}$, is computed based on the speech level estimate, $S_E$, and the A-weighted noise level estimate, $N_E$. The speech level estimate is a smoothed averaged signal level during periods of speech as determined by a speech activity detector. Therefore, time intervals in which the inbound signal does not have a detected speech signal do not contribute to the speech level estimate. In some examples, the time constant of the averaging is approximately 2 seconds.

The noise level estimate, $N_E$, is based on time intervals of the microphone signal that neither include speech, as determined by a second speech activity detector, nor include burst noise as might be caused by wind. The remaining time intervals are used to compute a signal level periodically, for example, every 8 ms ("noise analysis frames"). The noise level estimate is formed by tracking the computed signal level with a limit on the upward slew rate of 6 dB/s and a downward slew rate limit of 9 dB/s. One technical problem addressed by this approach is that the microphone may be sensitive to wind in outdoor environments, which causes over-estimates of the ambient noise level resulting in increases in the gain to levels that are higher than desirable or comfortable. For example, the wind induced noise levels may be as much as 20 dB higher than the noise levels addressed by the DNC gain adjustment.

The noise burst detector is based on a threshold and a time constant. Input signal intervals that are not declared to be speech by the speech activity detector are compared against the noise burst threshold. The noise burst interval starts when the level exceeds the threshold, and continues until the input level is below the threshold for a consecutive number of non-speech noise analysis frames equal in duration to the time constant.

Figure 6:
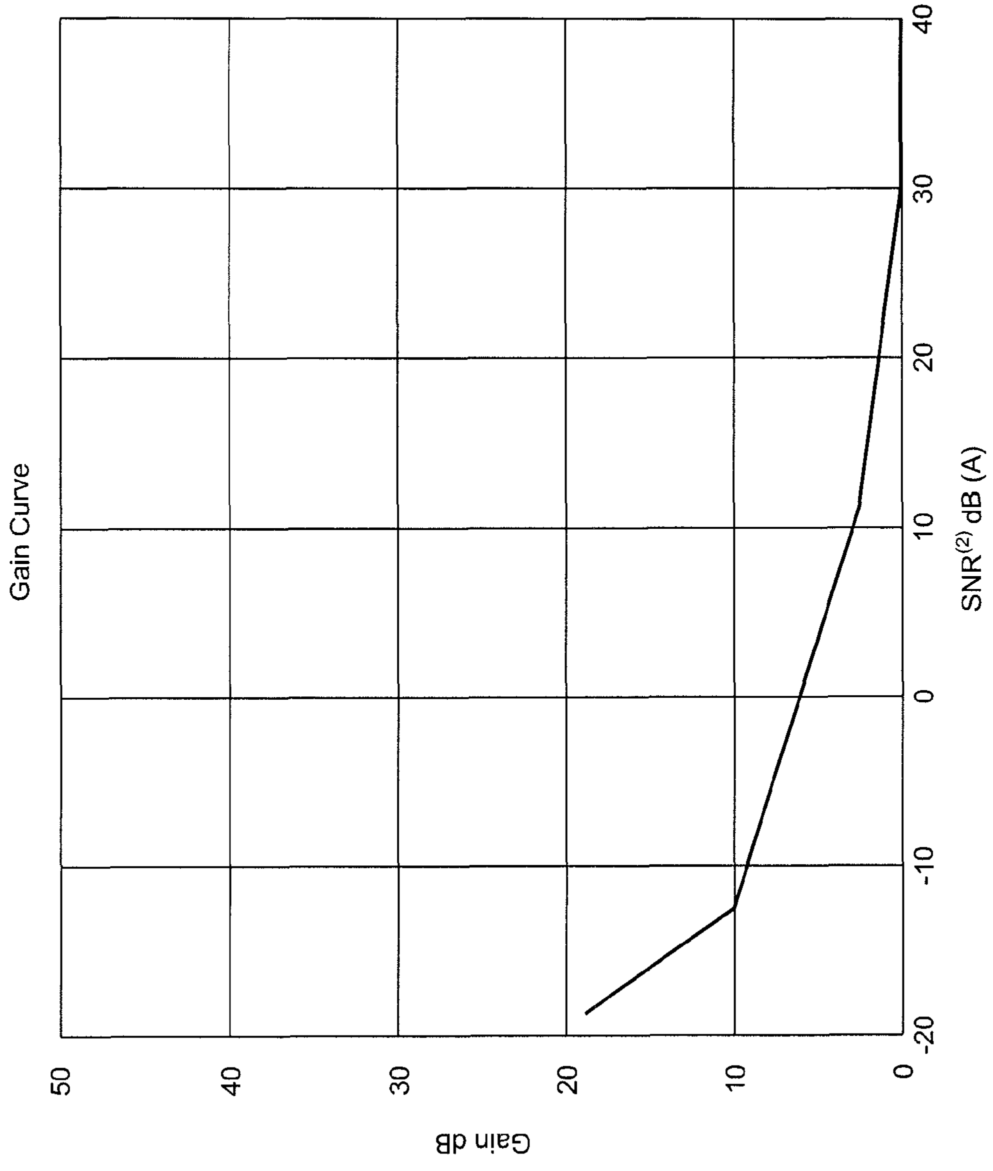
FIG. 6 shows a gain curve.

The signal to noise level estimate, $SNR^{(2)}$, is applied by target gain computation circuitry 508 to a gain curve, one example of which is shown in FIG. 6, to determine a target gain adjustment, $G_{TGT}$. In the depicted example of FIG. 5, the target gain adjustment, $G_{TGT}$, is applied by the gain adjustment circuitry 502 in combination with the user-selected gain (i.e., by adding the decibel gain values) to the inbound audio signals, $S_R$, to produce system-gain-adjusted audio signals, $S_{SGA}$, which are then outputted to an ear of the headset user. The resulting signal to noise level, after application of both gain values, is essentially $SNR^{(3)}=SNR^{(2)}+G_{TGT}$. Generally, the resulting $SNR^{(3)}$ is maintained above a minimum level (e.g., −2 dB) at low signal-to-noise levels (e.g., until about $SNR^{(2)}=-12$ dB), and makes a relatively smooth transition such that and at high signal-to-noise levels, $SNR^{(3)}$ approaches the $SNR^{(2)}$.

In the depicted example of FIG. 6, the gain curve has a slope much less than 1 dB/dB for high SNR situations where little gain adjustment is required; the gain curve has a slope between −0.2 dB/dB and −1 dB/dB for moderate to poor SNR situations (e.g., between −12 dB and 12 dB); the gain curve has a slope of −1 dB/dB or greater when the SNR is very poor (e.g., less than −12 dB). The shape of the gain curve depicted in FIG. 6 provides a volume adjustment that yields a comfortable listening level, and in effect, mimics the manner in which a typical headset user would adjust the manual volume control of the headset given the changes in the far-end talker's speech levels and/or ambient noise levels.

As introduced above, the volume control frameworks in some integrated Bluetooth™-enabled devices may support minimum volume change increments of 3 dB per step. If the gain adjustment circuitry 502 of FIG. 5 is implemented using such a volume control framework, it may be desirable to augment the volume control framework to provide smaller gain change increments than those provided by the volume control. In this manner, audible gain change increment artifacts may be reduced and a superior, if not optimal, headset user experience may be achieved.

Figure 7:
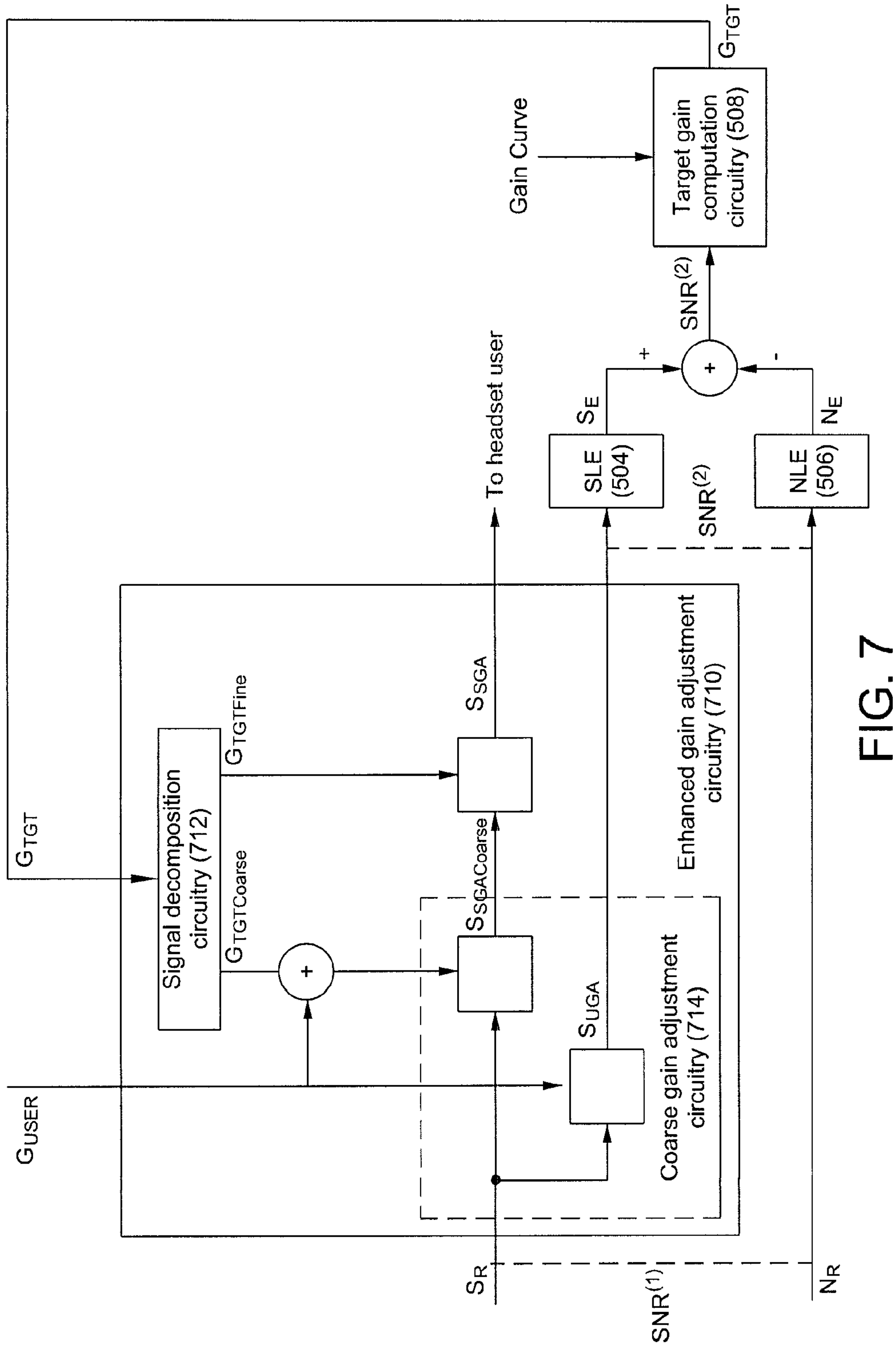
FIG. 7 shows a block diagram of another implementation of an in-ear headset.

FIG. 7 shows a block diagram of one implementation of the headset 10. Inbound audio signals, $S_R$, representative of the far-end talker's speech are received over a wireless communication link (e.g., a Bluetooth™ link to a paired mobile telephone). A user-selected gain, $G_{USER}$, is applied to the inbound audio signals, $S_R$, by coarse gain adjustment circuitry 712 of the headset 10 to produce user-gain-adjusted inbound audio signals, $S_{UGA}$. A speech level estimate, $S_E$, an A-weighted noise level estimate, $N_E$, and a target gain adjustment, $G_{TGT}$, are generated in a manner similar to that described in FIG. 5. The target gain adjustment, $G_{TGT}$, is decomposed into a coarse gain adjustment component, $G_{TGTCoarse}$, and a fine gain adjustment component, $G_{TGTFine}$, by signal decomposition circuitry 712 of an enhanced gain adjustment circuitry 710. The coarse gain adjustment component, $G_{TGTCoarse}$, and the fine gain adjustment component, $G_{TGTFine}$, are synchronized in their application to the inbound audio signals, $S_R$. The coarse gain adjustment, $G_{TGTCoarse}$, is applied with the user-selected gain, $G_{USER}$, to the inbound audio signals, $S_R$, to produce system-coarse-gain-adjusted signals, $S_{SGAcoarse}$. The fine gain adjustment, $G_{TGTFine}$, is applied to the coarse-gain-adjusted audio signals, $S_R$, to produce the system-gain-adjusted audio signals, $S_{SGA}$, which are then outputted to an ear of the headset user. In some implementations, the inbound signal has a digital representation until application of the fine gain adjustment. In some implementations, the fine gain adjustment is implemented by modifying a reference signal applied to a Digital-to-Analog Converter (DAC) that converts the digital representation of the coarse-grain-adjusted audio signal to an analog representation of the system-gain-adjusted audio signal.

A technical advantage that may be addressed by decomposition into coarse gain adjustments is that using existing digital circuitry for implementing the coarse gain adjustment can simplify or improve characteristics (e.g., noise) of the fine gain adjustment circuitry, for example, by limiting the range of gains that can be applied. For example, a commercially available circuit that embodies the coarse gain adjustment for the inbound audio path, and that may also include some or all of the radio interface and/or the outbound audio path can be combined in the microphone package with circuitry for fine gain adjustment based on the sensed level of ambient noise.

It is to be understood that the foregoing description is intended to illustrate and not to limit the scope of the invention, which is defined by the scope of the appended claims. Other embodiments are within the scope of the following claims.

What is claimed is:

1. A method comprising:

deriving a signal-to-noise ratio based at least in part on a measured level of a signal carrying far-end speech, a measured level of a signal carrying ambient acoustic noise, and a user-selected gain adjustment provided via a user-operable gain controller;

determining a target gain adjustment based at least in part on the derived signal-to-noise ratio, and based at least in part on a mapping of signal-to-noise ratio to gain in which the mapping approaches a unity gain (0 dB) at high signal-to-noise ratios and has a negative slope of nonincreasing magnitude as the signal-to-noise ratios increase from low to high;

applying the target gain adjustment to the signal carrying far-end speech to produce a gain-adjusted signal; and providing the gain-adjusted signal for audio output from a communications device.

2. The method of claim 1, wherein the communications device comprises a wireless in-ear headset.

3. The method of claim 1, wherein the user-operable gain controller is a component of the communications device.

4. The method of claim 1, wherein the mapping is expressed as a gain curve.

5. A communications device comprising:

a user-operable gain controller;

first circuitry operable to derive a signal-to-noise ratio based at least in part on a measured level of a signal carrying far-end speech, a measured level of a signal carrying ambient acoustic noise, and a user-selected gain adjustment provided via the user-operable gain controller;

second circuitry operable to determine a target gain adjustment based at least in part on the derived signal-to-noise ratio, and based at least in part on a mapping of signal-to-noise ratio to gain in which the mapping approaches a unity gain (0 dB) at high signal-to-noise ratios and has a negative slope of nonincreasing magnitude as the signal-to-noise ratios increase from low to high; and third circuitry operable to apply the target gain adjustment to the signal carrying far-end speech to produce a gain-adjusted signal and provide the gain-adjusted signal for output from the device.

6. The device of claim 5, further comprising:

an electronics module to wirelessly receive audio signals carrying far-end speech and wirelessly transmit audio signals carrying near-end speech.

7. The device of claim 5, further comprising:

an audio module including an acoustic driver to transduce audio signals to acoustic energy.

8. The device of claim 5, wherein the device comprises an in-ear component that includes:

an outlet section dimensioned and arranged to fit inside an ear canal of a user; and a passageway to conduct acoustic energy from an audio module to an opening in the outlet section.

9. The device of claim 5, further comprising:

an electronics module including a microphone having multiple acoustic ports.

10. The device of claim 9, wherein the microphone has two acoustic ports with a center-to-center spacing of approximately 6.5 mm.

11. The device of claim 9, further comprising:

a porous member arranged over the microphone to reduce wind noise.

* * * * *